(12) United States Patent
Matsubara

(10) Patent No.: US 6,320,818 B1
(45) Date of Patent: Nov. 20, 2001

(54) SEMICONDUCTOR STORAGE DEVICE, AND METHOD FOR GENERATING TIMING OF SIGNAL FOR ACTIVATING INTERNAL CIRCUIT THEREOF

(75) Inventor: Hiroyuki Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/532,237

(22) Filed: Mar. 22, 2000

(30) Foreign Application Priority Data

Mar. 26, 1999 (JP) ................................. 11-083861

(51) Int. Cl.[7] ............................................ G11C 8/00
(52) U.S. Cl. ................................... 365/233; 365/230.08
(58) Field of Search ...................... 365/233, 189.05, 365/189.03, 230.08, 194

(56) References Cited

U.S. PATENT DOCUMENTS

| | | | | |
|---|---|---|---|---|
| 5,793,665 | * | 8/1998 | Kim et al. | 365/104 |
| 5,986,918 | * | 11/1999 | Lee | 365/103 |
| 6,081,476 | * | 6/2000 | Hotta | 365/233 |
| 6,104,668 | * | 8/2000 | Lee et al. | 365/233 |

* cited by examiner

*Primary Examiner*—Richard Elms
*Assistant Examiner*—Hien Nguyen
(74) *Attorney, Agent, or Firm*—Scully, Scott, Murphy & Presser

(57) ABSTRACT

A semiconductor storage device of the present invention includes a unit for determining a pulse width by using a command input signal as a start point and thereby making a sense-amplifier activation signal or a latch capture signal of a synchronous mask ROM synchronize with activation or inactivation of a clock signal after cycles corresponding to the number of clocks of a set latency to generate timing.

6 Claims, 8 Drawing Sheets

US 6,320,818 B1

SEMICONDUCTOR STORAGE DEVICE, AND METHOD FOR GENERATING TIMING OF SIGNAL FOR ACTIVATING INTERNAL CIRCUIT THEREOF

BACKGROUND OF THE INVENTION

1. Field of the Invention

The present invention relates to a semiconductor storage device and a method for generating a signal for activating an internal circuit thereof.

2. Description of the Prior Art

To generate a sense-amplifier activation signal or a latch capture signal, timing is conventionally generated from a READ command input signal by using only an internal delay circuit. Therefore, it is necessary to optimize the timing by considering the power-supply dependence and temperature dependence of the internal delay circuit and threshold voltage dependence of a transistor and thereby, optimization of the timing has made design difficult.

Moreover, even if timing is set, a temporal position of the timing has been greatly fluctuated when power supply, temperature, or threshold value of a transistor is changed. Therefore, fluctuation from a set value decreases an operation margin.

Particularly, in the case of a synchronous mask ROM, it is necessary to latch the data to be output within a predetermined cycle period and moreover, timing is designed by considering temperature, voltage, and delay of the timing due to a diffusion parameter so that latching of the data is completed in the cycle period. Therefore, design is complex.

FIG. 12 shows a block diagram of a conventional example.

The structure in FIG. 12 comprises a timing generation circuit 22, cells A31 to D34, sense amplifiers A41 to D44, latches A51 to D54, and an output buffer 23. A pulse signal READ generated when inputting a READ command is input to the timing generation circuit 22 and a sense-amplifier activation signal SAEB and a latch capture signal SALT are output.

The sense-amplifier activation signal SAEB is input to the sense amplifiers A41 to D44 and the latch capture signal SALT is input to the latches A51 to D54. Moreover, outputs of the latches A51 to D54 are input to the output buffer 23 so as to be selectively conducted in accordance with select signals BURST0 to BURST3. Data input to the output buffer 23 is output synchronously with an internal clock signal ICLK synchronizing with an external clock.

The timing diagram in FIG. 13 is a timing diagram for explaining a clock of the conventional example in FIG. 12. FIG. 14 shows a timing generation circuit 22 of the conventional example and FIG. 15 shows a timing diagram of the timing generation circuit.

Operations of the conventional example will be described below. FIG.12 is a block diagram of the conventional example and FIG. 13 is a timing diagram of the conventional example. Operations shown in FIG. 12 will be described below.

When inputting a READ command to an external clock CLK, pulse signals RECMDB and READ are generated. These pulse signals do not synchronize with an internal clock ICLK but they generate a sense-amplifier activation signal SAEB and a latch capture signal SALT through the timing generation circuit 22 using delay circuits 24 and 25. That is, timings of the SAEB and SALT do not depend on the timing of the external clock CLK but they determine pulse widths (①  and ② in FIG. 13). The sense-amplifier activation signal SAEB activates the sense amplifiers A41 to D44 and reads data from the cells A31 to D34 to output the data. The latch capture signal SALT activates the latches A51 to D54 to latch the data output from the sense amplifiers A41 to D44. These operations are performed in a latency (waiting time) period.

Data latched in the latency period is input to the output buffer depending on which one of the signals BURST0 to BURST3 for respectively determining a burst output is selected. FIG. 13 shows a case in which BURST0, BURST1, and BURST2 are selected in order. Therefore, BURST0 is first selected after the latency period and the data in the latch A51 is input to the output buffer. Then, OA0 is output synchronously with an internal clock ICLK. This is a burst period. Because BURST1 is selected next to BURST0, the data in the latch B52 is output at the next cycle and OA1 is output. This is a system of previously completing latching of cell data and outputting the data latched in a burst period every cycle. Therefore, it is necessary to complete latching of the data in the latency period.

Circuit operations of the conventional example for realizing the above mentioned will be described below.

FIG. 14 is a timing generation circuit 22 of the conventional example. Operations of this circuit will be described below by referring to the timing diagram in FIG. 14. When a READ command is input, a pulse is input to a READ terminal in FIG. 14. A sense-amplifier activation signal SAEB is set to 'L' level by the pulse signal READ. Then, a pulse shown in FIG. 15 is generated from SAEB and SALT in accordance with delays A24 and B25 (shown by A and B in FIG. 15).

As a result, as shown by the timing diagram in FIG. 15, a sense-amplifier activation signal SAEB and a latch capture signal SALT become pulses not synchronizing with an internal clock ICLK but they are determined by delay A24 and delay B25.

Delays A24 and B25 are generated by using a transistor or a wiring capacitance. However, because the delays A24 and B25 fluctuate due to voltage, temperature, or diffusion parameters, it is difficult to set the delays A24 and B25 when using them as the timings for completing data latching within the latency period.

In case of the above prior art, to generate the timing of a sense-amplifier activation signal or latch capture signal, timing is generated from a READ command input signal by using only an internal delay circuit. Therefore, it is necessary to optimize timing by considering the power supply and temperature dependence of the internal delay circuit and the threshold voltage dependence of a transistor. Therefore, optimization of the timing makes design difficult.

Moreover, even if timing is set, a temporal position of the timing has been greatly fluctuated when power supply, temperature, or threshold value of a transistor is changed. Therefore, fluctuation from a set value decreases an operation margin.

Particularly, in case of a synchronous mask ROM, where it is necessary to latch the data to be output in a predetermined cycle period and to design timing so that latching is completed in the cycle period, it is difficult to design the timing because of a delay due to temperature, voltage, or diffusion parameters.

BRIEF SUMMARY OF THE INVENTION

Objects of the Invention

It is an object of the present invention to provide a semiconductor storage device capable of optimizing timing independently of a power supply, temperature dependence, or threshold voltage dependence of a transistor and a method for generating the timing of a signal for activating an internal circuit of the memory.

SUMMARY OF THE INVENTION

A semiconductor storage device of the present invention comprises:

means for determining a pulse width by using a command input signal as a start point and thereby, making a sense-amplifier activation signal or a latch capture signal of a synchronous mask ROM synchronize with activation or inactivation of a clock signal after cycles corresponding to the number of clocks of a set latency to generate timing.

Moreover, it is permitted to use an external clock when a READ command is input as the command input signal.

Furthermore, it is permitted that the semiconductor storage device comprises a latency calculation circuit, a timing generation circuit, a plurality of cells, a plurality of sense amplifiers, a plurality of latches, and a plurality of output buffers; the latency calculation circuit has means for receiving a plurality of signals for determining a latency, an internal clock signal generated from an external clock, and a signal generated when a READ command is input and outputting a plurality of signals to the timing generation circuit; the timing generation circuit has means for receiving a pulse signal generated when a READ command is input and a reset signal, outputting a sense-amplifier activation signal to a plurality of sense amplifiers, and outputting a latch capture signal to a plurality of latches; a plurality of latches have means for selectively conducting an output of a latch in accordance with a select signal and thereby supplying the output to output buffers; and each output buffers has means for outputting data supplied from a latch synchronously with a clock signal synchronizing with an external clock.

A method of the present invention for generating the timing of a signal for activating an internal circuit of a semiconductor storage device comprises the steps of generating a pulse signal by inputting a READ command to an external clock; generating a sense-amplifier activation signal and a latch capture signal through a latency calculation circuit and a timing generation circuit synchronizing with an internal clock signal generated from an external signal in accordance with a pulse signal; activating a plurality of sense amplifiers in accordance with a sense-amplifier activation signal and thereby, reading data from a plurality of cells and outputting the data; activating a plurality of latches and thereby latching the data output from a plurality of sense amplifiers; inputting the data latched during a latency period to output buffers depending on which one of select signals for determining a burst output is selected; and outputting the data supplied from a latch through output buffers synchronously with an internal clock signal.

Moreover, it is permitted that a method for operating a latency calculation circuit comprises the steps of generating a pulse signal by inputting a READ command; receiving a plurality of signals for respectively determining a latency; storing data in a register every cycle in accordance with an internal clock signal generated from an external clock; and outputting a plurality of signals to a timing generation circuit synchronously with an internal clock signal.

Moreover, it is permitted that the step of generating a sense-amplifier activation signal and a latch capture signal through a timing generation circuit comprises the steps of generating a pulse signal by receiving a READ command; setting a sense-amplifier activation signal to 'L' level in accordance with a pulse signal; setting a latch capture signal to 'H' level in accordance with a first pulse signal output from a latency calculation circuit; and resetting a sense-amplifier activation signal to 'H' level, resetting a latch capture signal to 'L' level, and converting a sense-amplifier activation signal and a latch capture signal into pulses respectively synchronizing with an internal clock generated from the external clock.

Therefore, it is possible to optimize timing independently of a power supply, temperature dependence, or threshold voltage dependence of a transistor because of determining a pulse width by using an external clock when a READ command (CAS address) is input as a start point and thereby, making a sense-amplifier activation signal or latch capture signal of a synchronous mask ROM synchronize with activation or inactivation of a clock signal after cycles corresponding to the number of clocks of a set latency.

Moreover, by setting timing in accordance with this method, it is possible to increase an operation margin because a temporal position of timing hardly fluctuates even if a power supply, temperature, or transistor threshold value changes.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Embodiments of the present invention will be described below by referring to the accompanying drawings.

The first embodiment of the present invention comprises a latency calculation circuit 1, a timing generation circuit 2, cells A31 to D34, sense amplifiers A41 to D44, latches A51 to D54, and an output buffer 3. Signals CL3 and CL4 for respectively determining a latency, an internal clock signal CLK generated from an external clock, and a signal RECMDB generated when a READ command is input are input to the latency calculation circuit 1 and signals LATE0 and LATE1 are output to the timing generation circuit 2. A pulse signal READ generated when a READ command is input and a reset signal RESET are input to the timing generation circuit 2 and a sense-amplifier activation signal SAEB and a latch capture signal SALT are output.

The sense-amplifier activation signal SAEB is input to the sense amplifiers A41 to D44 and the latch capture signal SALT is input to the latches A51 to D54. Moreover, outputs of the latches A51 to D54 are input to the output buffer and selectively conducted by select signals BURST0 to BURST3. Data input to the output buffer 3 is output synchronously with an internal clock signal ICLK synchronizing with an external clock signal.

Figure 1:
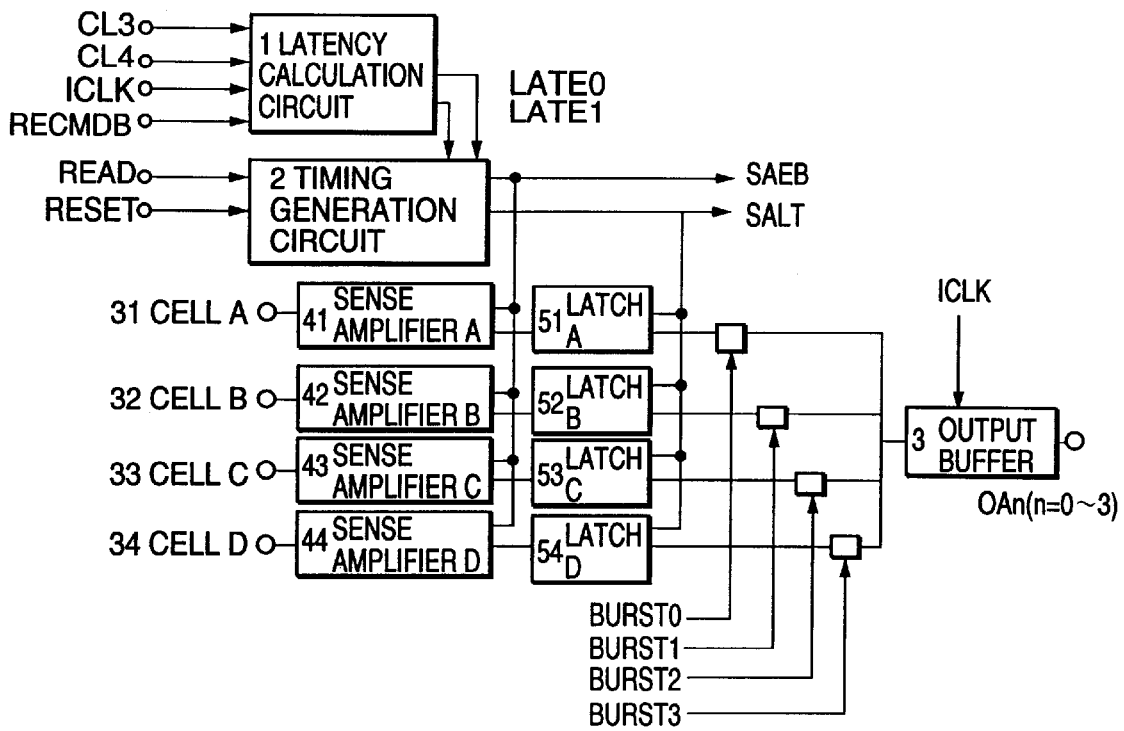
FIG. 1 is a block diagram of a first embodiment of the present invention.
Figure 2:
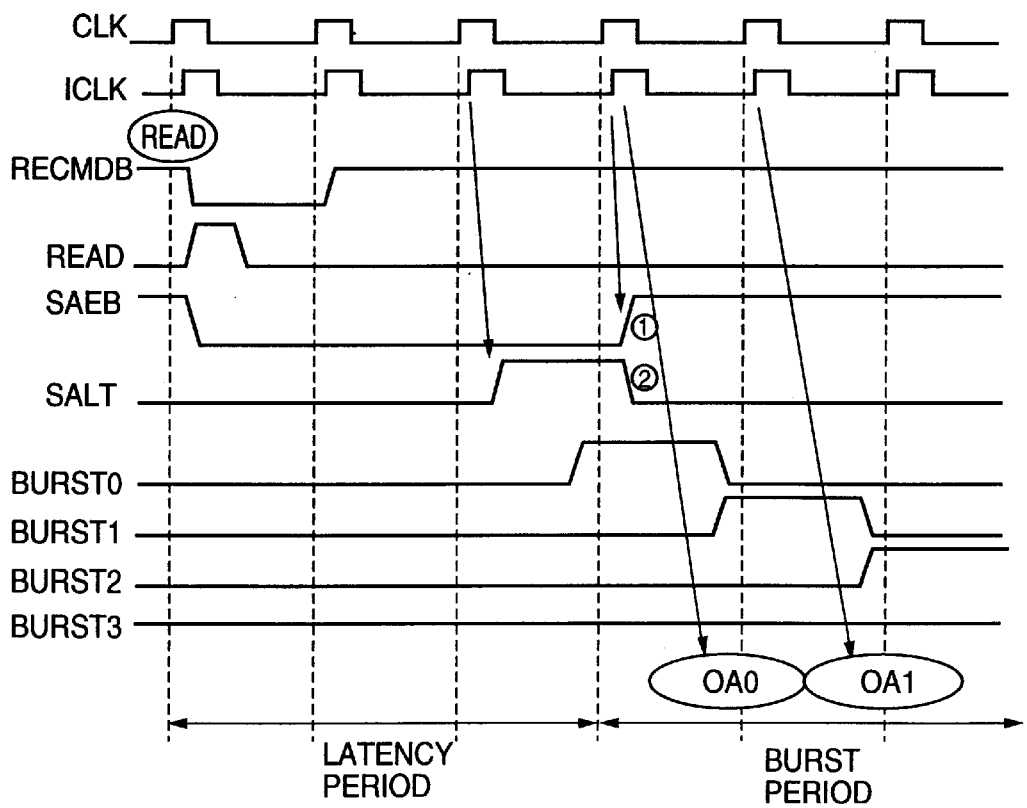
FIG. 2 is a timing diagram of the first embodiment of the present invention.
Figure 3:
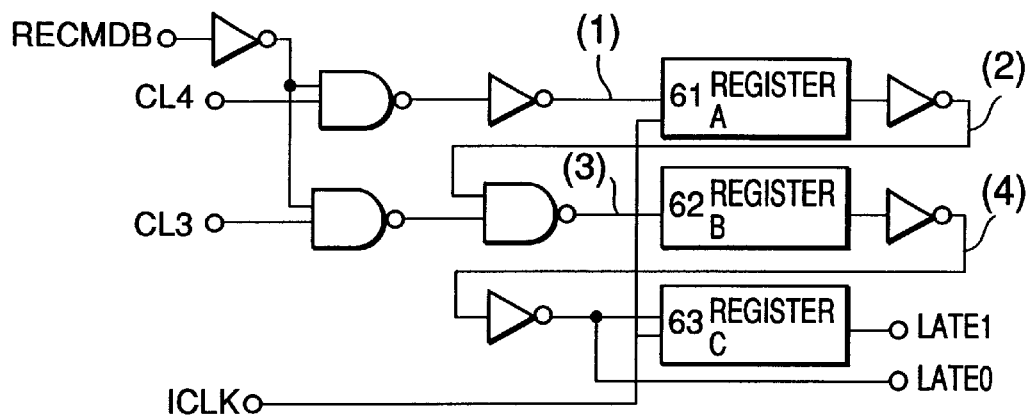
FIG. 3 is an illustration showing the latency calculation circuit of the first embodiment of the present invention.
Figure 4:
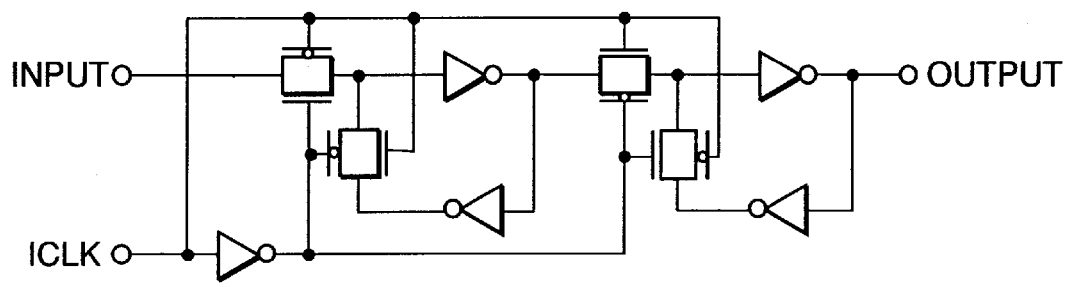
FIG. 4 is an illustration showing a register circuit in the latency calculation circuit in the first embodiment of the present invention.
Figure 5:
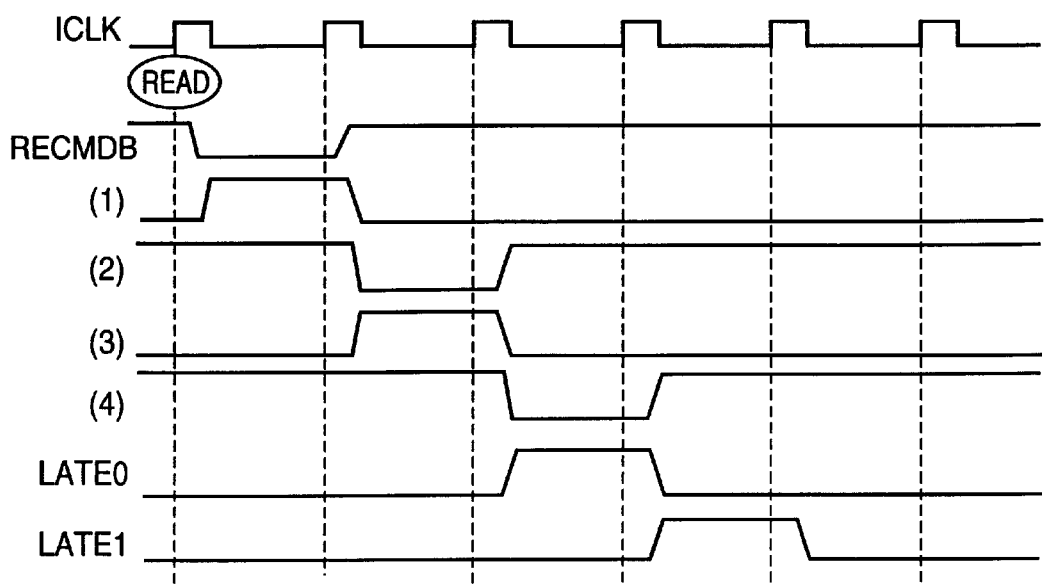
FIG. 5 is a timing diagram of a latency calculation circuit of the first embodiment of the present invention.

The timing diagram of the first embodiment of the present invention in FIG. 2 is a timing diagram for explaining the block diagram of the first embodiment of the present invention in FIG. 1. FIG. 3 shows the latency calculation circuit 1 of the first embodiment of the present invention, FIG. 4 shows the register circuit in the latency calculation circuit 1 of the first embodiment, and FIG. 5 shows the timing diagram of the latency calculation circuit 1 of the first embodiment.

Figure 6:
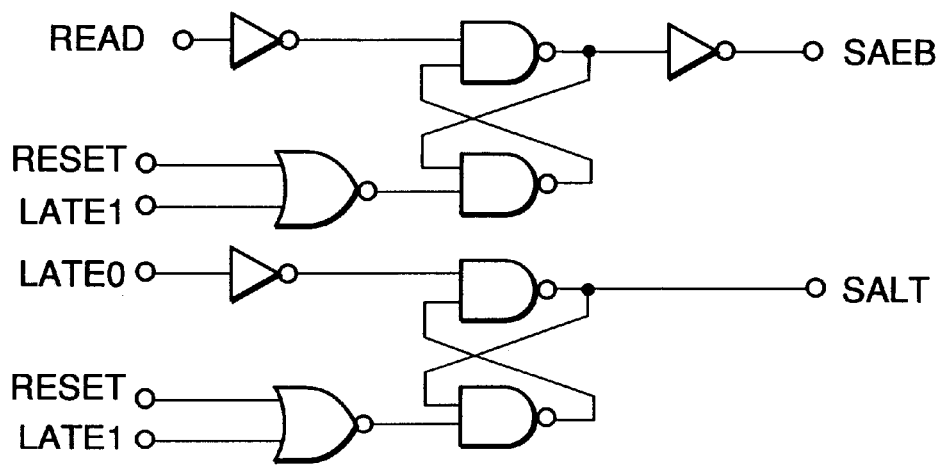
FIG. 6 is an illustration showing a timing generation circuit of the first embodiment of the present invention.
Figure 7:
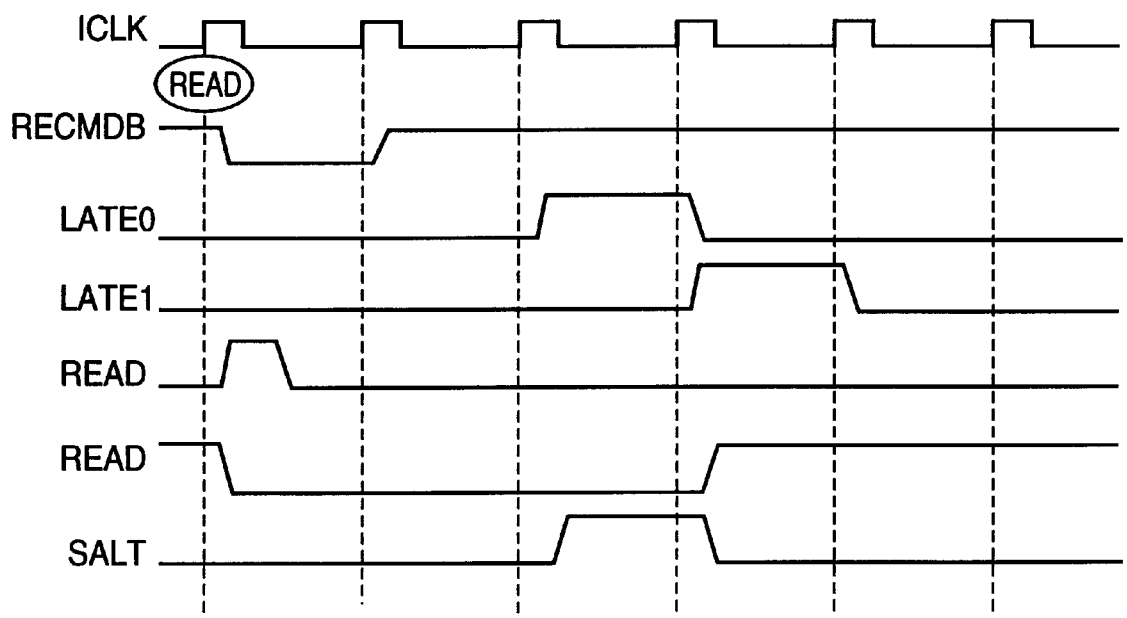
FIG. 7 is a timing diagram of the timing generation circuit of the first embodiment of the present invention.

FIG. 6 shows the timing generation circuit 2 of the first embodiment of the present invention and FIG. 7 shows the timing diagram of the timing generation circuit 2 of the first embodiment.

Then, operations of the first embodiment of the present invention will be described below.

FIG. 1 is the block diagram of the first embodiment of the present invention and FIG. 2 is the timing diagram of the first embodiment. Operations in FIG. 1 will be described below.

When inputting a READ command to an external clock CLK, pulse signals RECMDB and READ are generated. These pulse signals generate a sense-amplifier activation signal SAEB and a latch capture signal SALT through the latency calculation circuit 1 synchronizing and timing generation circuit 2 respectively synchronizing with an internal clock signal ICLK generated from an external clock. That is, timings of SAEB and SALT are generated synchronously with an internal clock signal ICLK generated from an external clock after a plurality of cycles (① and ② in FIG. 2). The sense-amplifier activation signal SAEB activates the sense amplifiers A41 to D44, and reads data from the cells A31 to D34 and outputs the data. The latch capture signal SALT activates the latches A51 to D54 and latches the data output from the sense amplifiers A41 to D44. The above operations are performed in the latency period in FIG. 2.

The data latched in the latency period is input to the output buffer depending on which one of the signals BURST0 to BURST3 for respectively determining a burst output is selected. FIG. 2 shows a case in which BURST0, BURST1, BURST2, and BURST3 are selected in order. Therefore, BURST0 is first selected after the latency period and data in the latch A51 is input to the output buffer. Then, OA0 is output synchronously with an internal clock signal ICLK. This is burst period. Because BURST1 is selected next to BURST0, the data in the latch A51 is output at the next cycle and OA1 is output.

That is, this is a system of previously completing latching of cell data in a latency period and outputting the latched data every cycle in a burst period. Therefore, it is necessary to complete latching of data within the latency period.

Circuit operations for realizing the above mentioned will be described below.

First, operations of the latency calculation circuit 1 shown by the block diagram in FIG. 1 are described. The circuit in FIG. 3 shows the latency calculation circuit 1 and operation-point timings of the circuit 1 are shown in FIG. 5. When a READ command is input, signals for one cycle are generated in RECMDB. When it is assumed that a latency is set to 4, CL4=H and CL3=L are input. Data is stored in three registers every cycle by an internal clock signal ICLK generated from an external clock. A register circuit is shown in FIG. 4, which inputs or outputs data synchronously with an internal clock signal ICLK. The data for LATE0 and LATE1 output from the latency calculation circuit 1 become pulses synchronizing with a clock as shown by the timing diagram in FIG. 5.

The signals LATE0 and LATE1 output from the latency calculation circuit 1 are input to the timing generation circuit 2. The timing generation circuit 2 is a circuit shown in FIG. 6. Operations of the circuit will be described below by referring to the timing diagram in FIG. 7. When a READ command is input, a pulse is input to the READ terminal in FIG. 6. A sense-amplifier activation signal SAEB is set to 'L' level in accordance with the pulse signal READ. Moreover, a latch capture signal SALT is set to 'H' level in accordance with the pulse of LATE0 output from the latency calculation circuit 1. Then, the sense-amplifier activation signal SAEB is reset to 'H' level and the latch capture signal SALT is reset to 'L' level in accordance with the pulse of LATE1 output from the latency calculation circuit 1 after one cycle of LATE0.

As a result, as shown by the timing diagram in FIG. 7, the sense-amplifier activation signal SAEB and latch capture signal SALT become pulses synchronizing with an internal clock signal ICLK generated from an external clock.

Figure 8:
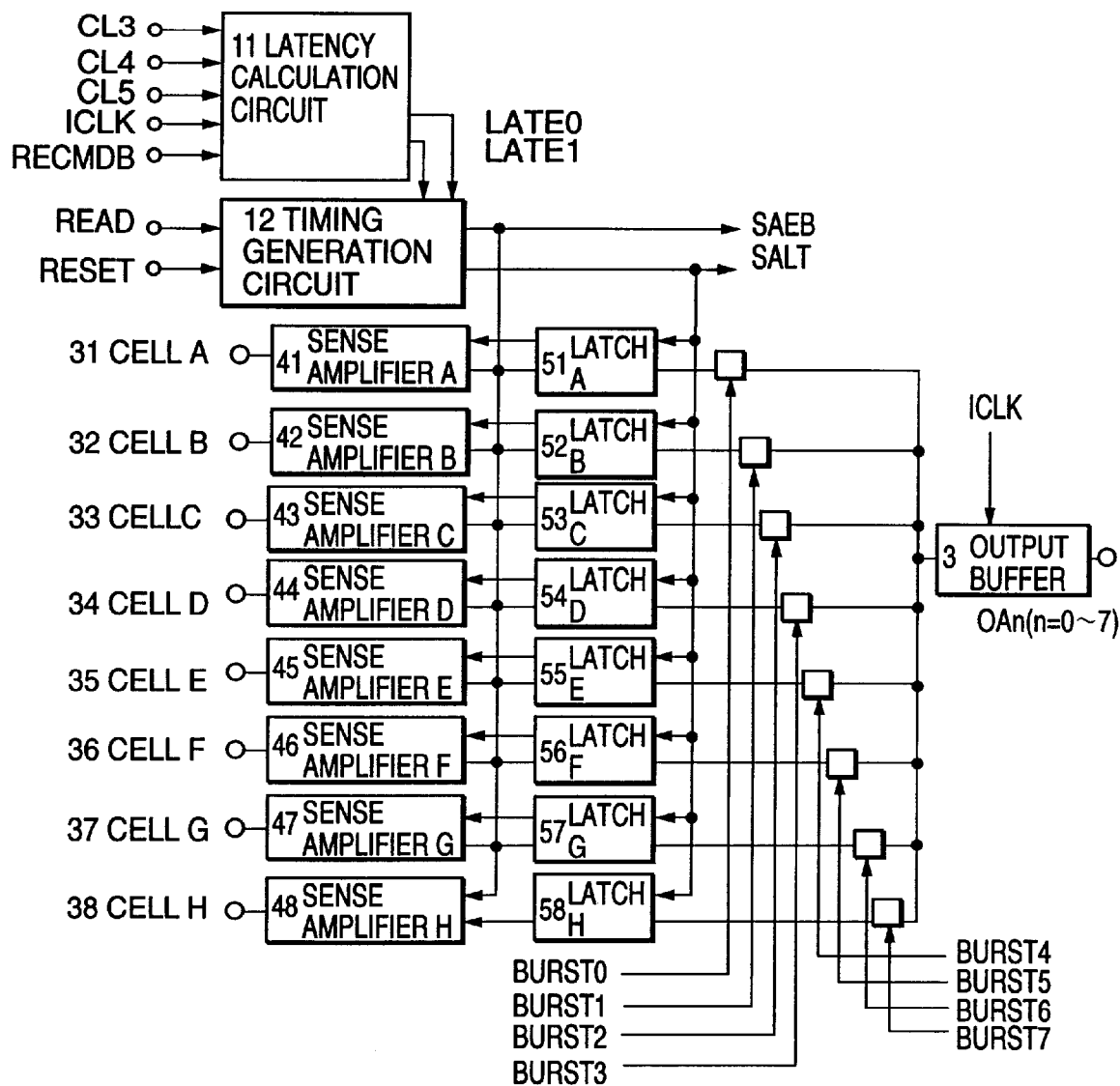
FIG. 8 is a block diagram of a second embodiment of the present invention.

FIG. 8 shows the block diagram of the second embodiment of the present invention.

The second embodiment of the present invention comprises a latency calculation circuit 11, a timing generation circuit 12, cells A31 to H38, sense amplifiers A41 to H48, latches A51 to H58, and an output buffer 13. Signals CL3, CL4, and CL5 for respectively determining a latency, an internal clock signal ICLK generated from an external clock, and a signal RECMDB generated when a READ command is input are input to the latency calculation circuit 11 and signals LATE0 and LATE1 are output to the timing generation circuit 12. A pulse signal READ generated when a READ command is input and a reset signal RESET are input to the timing generation circuit 12 and a sense-amplifier activation signal SAEB and a latch capture signal SALT are output.

The sense-amplifier activation signal SAEB is input to the sense amplifiers A41 to H48 and the latch capture signal SALT is input to the latches A51 to H58. Moreover, outputs of the latches A51 to H58 are input to the output buffer 13 and selectively conducted in accordance with select signals BURST0 to BURST7. The data input to the output buffer 13 is output synchronously with an internal clock signal ICLK synchronizing with an external clock.

Figure 9:
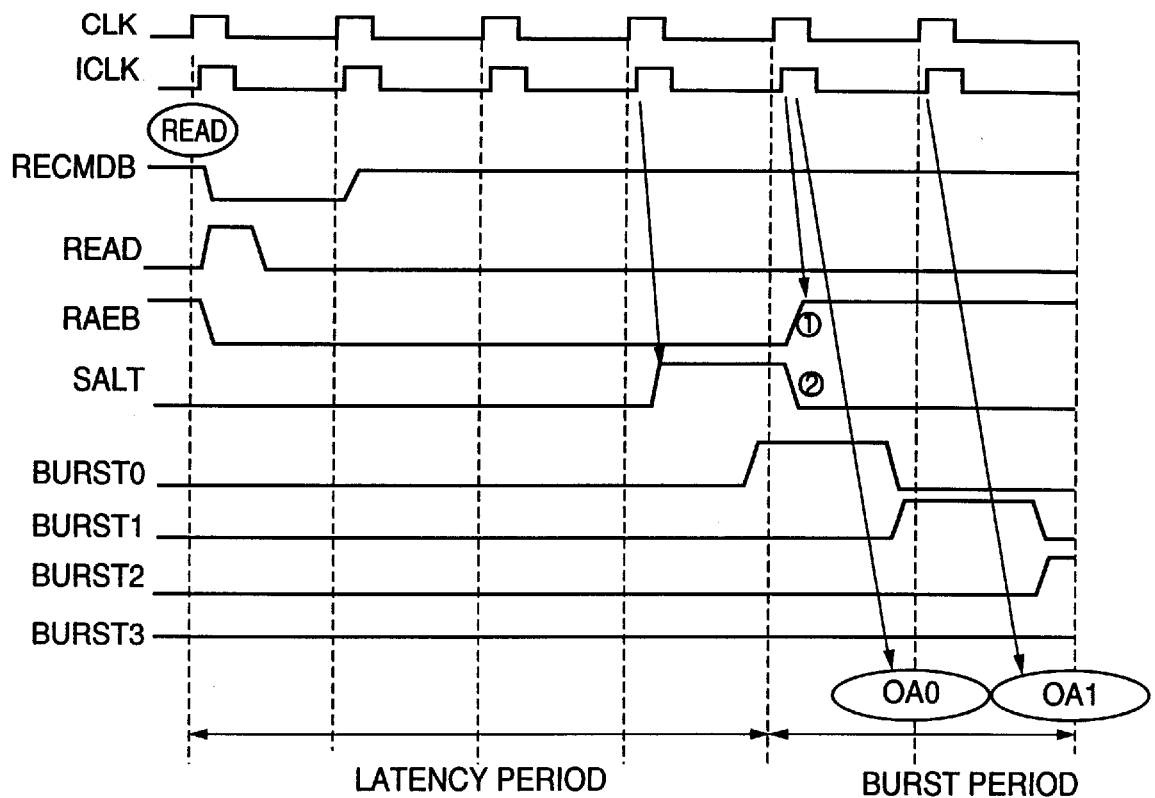
FIG. 9 is a timing diagram of the second embodiment of the present invention.
Figure 10:
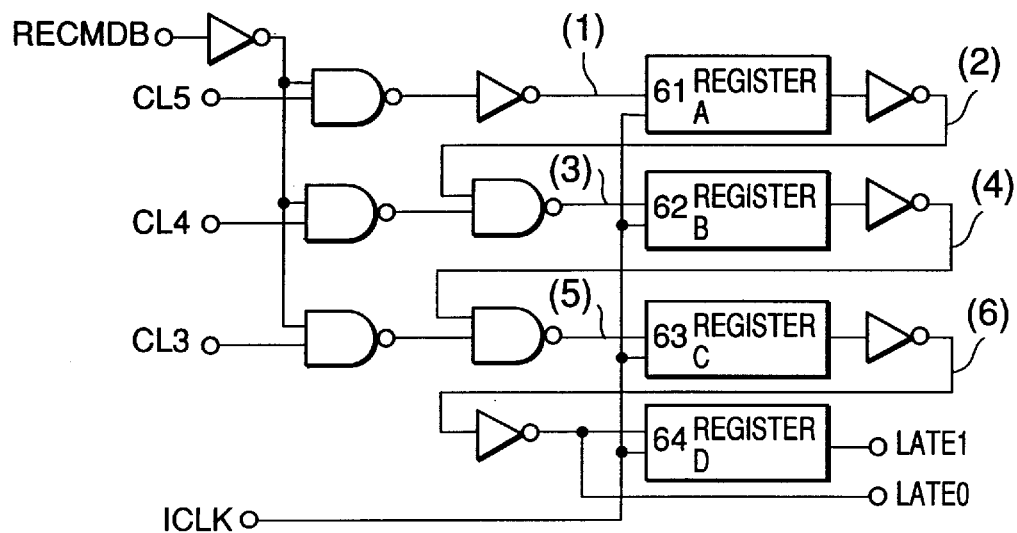
FIG. 10 is an illustration showing a latency calculation circuit of the second embodiment of the present invention.
Figure 11:
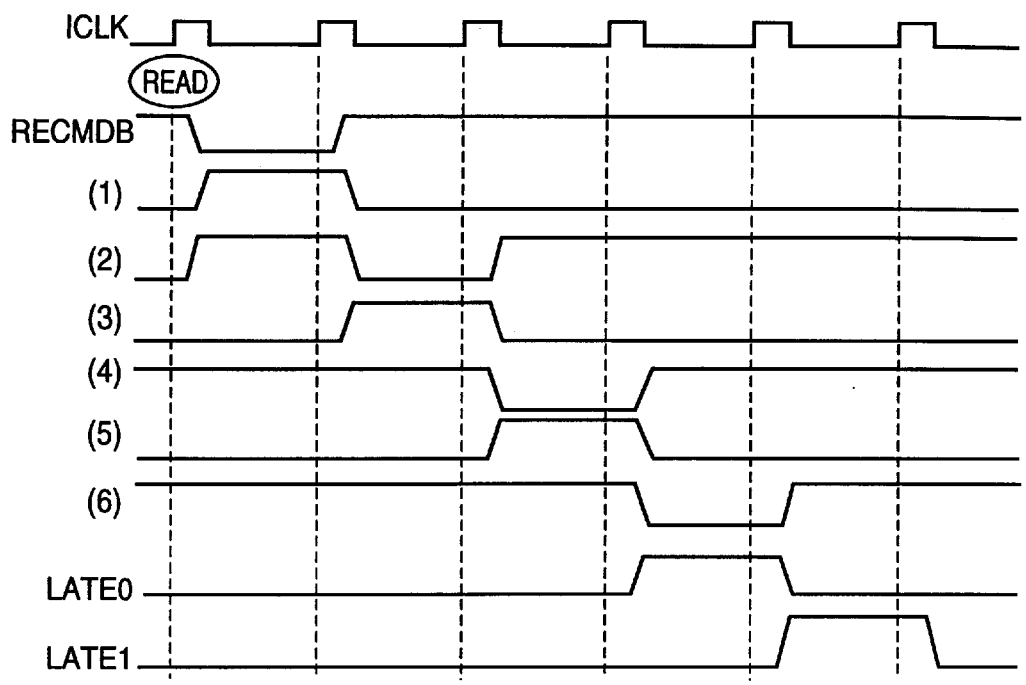
FIG. 11 is a timing diagram of the latency calculation circuit of the second embodiment of the present invention.
Figure 12:
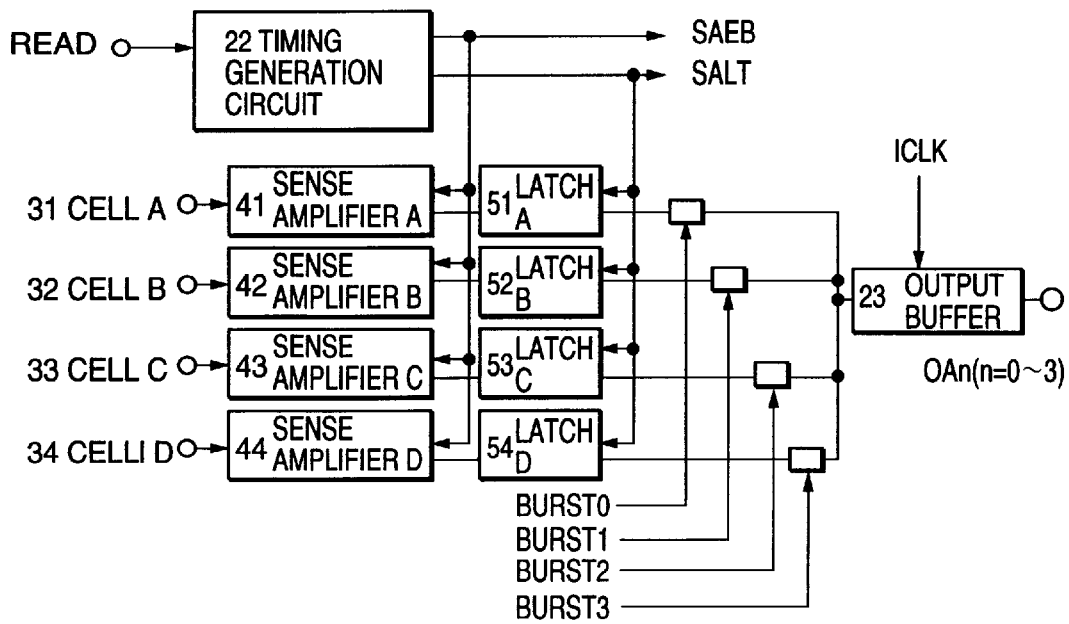
FIG. 12 is a block diagram of the conventional example.
Figure 13:
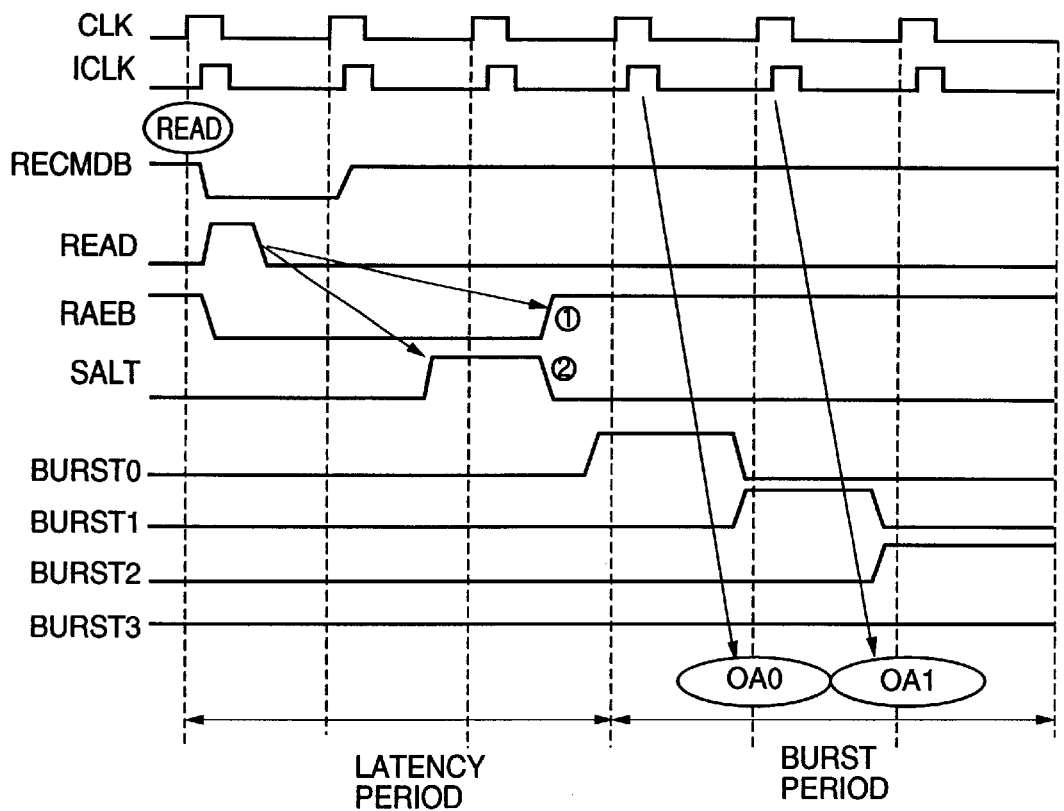
FIG. 13 is a timing diagram for explaining the block diagram of the conventional example in FIG. 12.
Figure 14:
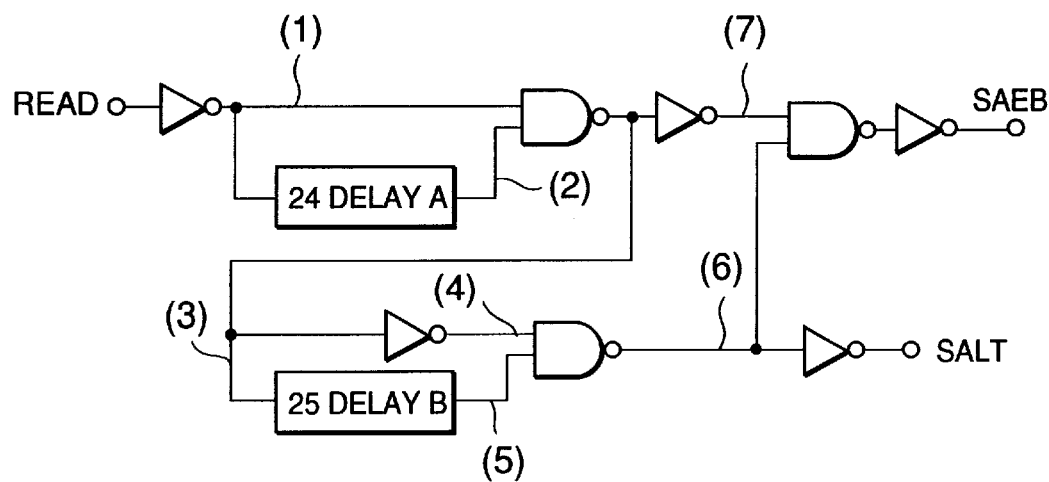
FIG. 14 is an illustration showing a timing generation circuit of the conventional example.
Figure 15:
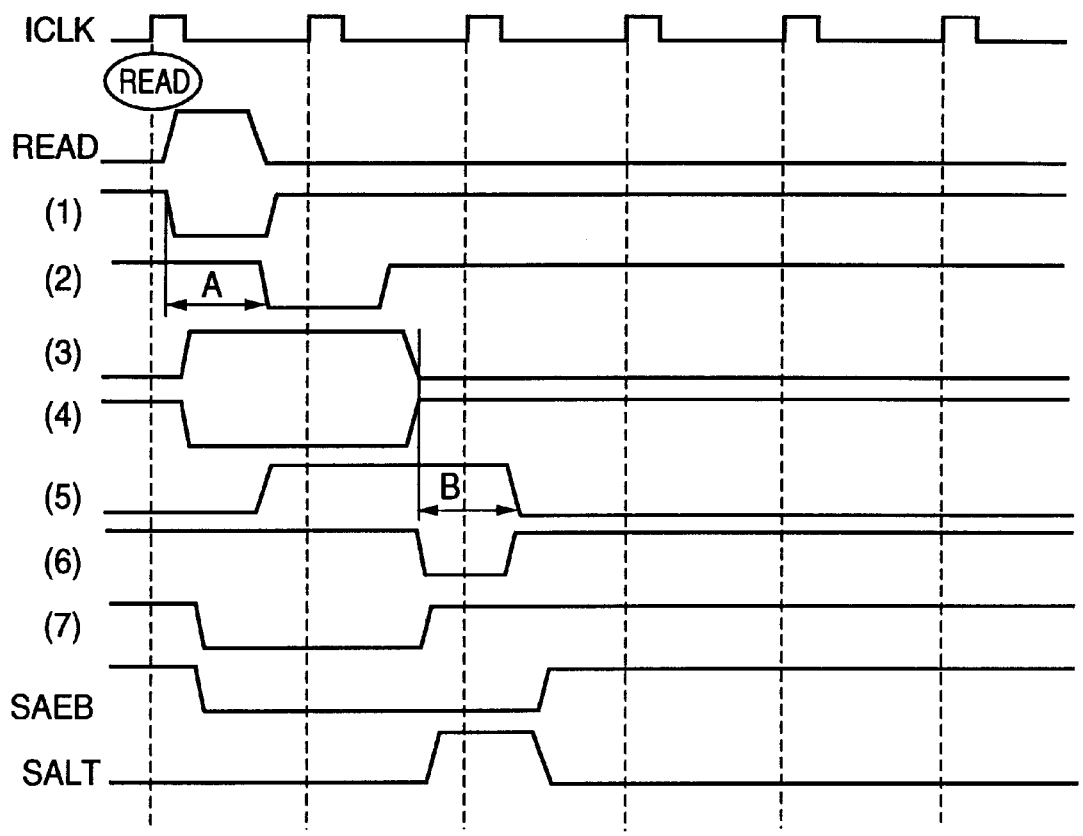
FIG. 15 is a timing diagram of the timing generation circuit of the conventional example.

The timing diagram in FIG. 9 is a timing diagram for explaining the block diagram of the second embodiment in FIG. 8. FIG. 10 shows the latency calculation circuit 11 of the second embodiment and FIG. 11 shows the timing diagram of the latency calculation circuit 11 of the second embodiment.

Operations of the second embodiment of the present invention will be described below.

FIG. 8 is the block diagram of the second embodiment and FIG. 9 shows the timing diagram of the second embodiment. Operations in FIG. 8 will be described below.

When inputting a READ command to an external clock CLK, pulse signals RECMDB and READ are generated. These pulse signals generate a sense-amplifier activation signal SAEB and a latch capture signal SALT through a latency circuit and a timing generation circuit respectively synchronizing with an internal clock signal ICLK generated from an external clock. That is, timings of SAEB and SALT are generated synchronously with an internal clock signal ICLK generated from an external clock after a plurality of cycles ((①) and (②) in FIG. 9). The sense-amplifier activation signal SAEB activates the sense amplifiers A41 to H48, and reads data from the cells A31 to H38 and outputs the data. The latch capture signal SALT activates the latches A51 to H58 and latches the data output from the sense amplifiers A41 to H48. The above operations are performed in the latency period in FIG. 9.

The data latched in the latency period is input to the output buffer depending on which one of the signals BURST0 to BURST7 for respectively determining a burst output is selected. FIG. 9 shows a case in which BURST0, BURST1, and BURST2 are selected in order. Therefore, BURST0 is first selected after the latency period and data in the latch A51 is input to the output buffer. Then, OA0 is output synchronously with an internal clock signal ICLK. This is burst period. Because BURST1 is selected next to BURST0, the data in the latch A51 is output at the next cycle and OA1 is output.

This is a system for previously completing latching of cell data in a latency period and outputting the latched data every cycle in a burst period similarly to the case of the first embodiment. Therefore, it is necessary to complete latching of data in a latency period.

Circuit operations for realizing the above mentioned will be described below.

First, operations of the latency calculation circuit 11 shown by the block diagram in FIG. 8 are described. The circuit in FIG. 10 shows the latency calculation circuit 11 and operation-point timings of the circuit 11 are shown in FIG. 11. When a READ command is input, signals for one cycle are generated in RECMDB. When it is assumed that a latency is set to 5, CL5=H, CL4=H, and CL3=L are input. Data is stored in four registers every cycle in accordance with an internal clock signal ICLK generated from an external clock. A register circuit is shown in FIG. 4, which inputs or outputs data synchronously with an internal clock signal ICLK. The data for LATE0 and LATE1 output from the latency calculation circuit 11 become pulses synchronizing with a clock as shown by the timing diagram in FIG. 11. Because the latency is set to 5, pulses of LATE0 and LATE1 are respectively one cycle later compared to the case of the first embodiment.

The signals LATE0 and LATE1 output from the latency calculation circuit 11 are input to the timing generation circuit 12. The timing generation circuit 12 is a circuit shown in FIG. 6. Operations of the circuit are the same as those of the first embodiment.

As a result, as shown by the timing diagram in FIG. 9, the sense-amplifier activation signal SAEB and latch capture signal SALT become pulses synchronizing with an internal clock signal ICLK generated from an external clock.

As described above, the present invention has the following advantages.

That is, an advantage is obtained that it is possible to optimize timing independently of a power supply, temperature dependence, or threshold voltage dependence of a transistor because of determining a pulse width by using an external clock when a READ command (CAS address) is input as a start point and thereby, making a sense-amplifier activation signal or latch capture signal of a synchronous mask ROM synchronize with activation or inactivation of a clock signal after cycles corresponding to the number of clocks of a set latency.

Moreover, by setting timing in accordance with this method, an advantage is obtained that it is possible to increase an operation margin because a temporal position of timing hardly fluctuates even if a power supply, temperature, or transistor threshold value changes.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor storage device comprising:
   means for determining a pulse width by using a command input signal as a start point;
   means for activating and inactivating a clock signal, and;
   means for synchronizing with the clock signal a sense amplifier activation signal or latch capture signal of a synchronous mask ROM, after cycles corresponding to the number of clocks of a set latency, to generate timing.

2. The semiconductor storage device according to claim 1, wherein said command input signal is an external clock when a READ command is input.

3. A semiconductor storage device comprising:
   means for determining a pulse width by using an external clock signal when a READ command is input as a start point and thereby, making a sense-amplifier activation signal or latch capture signal of a synchronous mask ROM synchronize with activation or inactivation of a clock signal after cycles corresponding to the number of clocks of a set latency to generate timing; and a latency calculation circuit, a timing generation circuit, a plurality of cells, a plurality of sense amplifiers, a plurality of latches, and an output buffer, wherein:
   said latency calculation circuit has means for receiving a plurality of signals for determining the latency, an internal clock signal generated from said external clock, and a signal generated when the READ command is input and outputting a plurality of signals to said timing generation circuit;
   said timing generation circuit has means for receiving a pulse signal generated when the READ command is input and a reset signal, outputting said sense-amplifier activation signal to said sense amplifiers, and outputting said latch capture signal to said latches;
   said latches have means for inputting outputs of said latches to said output buffer by selectively conducting said outputs in accordance with select signals; and said output buffer has means for outputting said data input from said latches synchronously with said internal clock signal synchronizing with said external clock.

4. A method for generating the timing of a signal for activating an internal circuit of a semiconductor storage device, configured by means for determining a pulse width by using an external clock signal when a READ command is input as a start point and thereby, making a sense-amplifier activation signal or latch capture signal of a synchronous mask ROM synchronize with activation or inactivation of a clock signal after cycles corresponding to the number of clocks of a set latency to generate timing; and a latency calculation circuit, a timing generation circuit, a plurality of cells, a plurality of sense amplifiers, a plurality of latches, and an output buffer, in which:

said latency calculation circuit has means for receiving a plurality of signals for determining said latency, an internal clock signal generated from said external clock, and a signal generated when said READ command is input and outputting a plurality of signals to said timing generation circuit;

said timing generation circuit has means for receiving a pulse signal generated when said READ command is input and a reset signal, outputting said sense-amplifier activation signal to said sense amplifiers, and outputting said latch capture signal to said latches;

said plurality of latches have means for inputting outputs of said latches to said output buffer by selectively conducting said outputs in accordance with select signals; and said output buffer has means for outputting said data input from said latches synchronously with said internal clock signal synchronizing with said external clock, said method comprising the steps of:

generating a pulse signal by inputting a READ command to said external clock;

generating said sense-amplifier activating signal and said latch capture signal through said latency calculation circuit and said timing generation circuit respectively synchronizing an internal clock signal generated from said external clock in accordance with said pulse signal;

activating said sense amplifiers in accordance with said sense-amplifier activating signal, and thereby reading and outputting the data for the cells;

activating said latches in accordance with said latch capture signal and thereby latching said data output from said sense amplifiers;

inputting said data latched in a latency period to said output buffer depending on which one of select signals for respectively determining a burst output is selected; and outputting said data input from said latches to said output buffer synchronously with the internal clock signal.

5. The method for generating the timing of a signal for activating an internal circuit of a semiconductor storage device according to claim 4, wherein said latency-calculation-circuit operating method includes the steps of:

generating a pulse signal by receiving said READ command;

inputting a plurality of signals for determining said latency by setting the latency to a predetermined value;

storing data in a register every cycle in accordance with said internal clock signal generated from said external clock; and outputting a plurality of signals to said timing generation circuit synchronously with said internal clock signal.

6. The method for generating the timing of a signal for activating an internal circuit of a semiconductor storage device according to claim 4, wherein the step of generating the sense-amplifier activation signal and a latch capture signal through said timing generation circuit includes the steps of:

generating a pulse signal by inputting said READ command;

setting said sense-amplifier activation signal to 'L' level in accordance with said pulse signal;

setting said latch capture signal to 'H' level in accordance with a first pulse signal output from said latency calculation circuit; and resetting the sense-amplifier activation signal to 'H' level in accordance with a second pulse signal output from said latency calculation circuit one cycle after said first pulse signal, resetting said latch capture signal to 'L' level, and converting the sense-amplifier activation signal and said latch capture signal into pulses synchronizing with said internal clock generated from said external clock.

* * * * *